United States Patent
Lin et al.

(10) Patent No.: US 12,355,018 B2
(45) Date of Patent: Jul. 8, 2025

(54) DISPLAY PANEL AND DISPLAY DEVICE

(71) Applicant: AUO Corporation, Hsinchu (TW)

(72) Inventors: Yi-Hsin Lin, Hsinchu (TW);
Wen-Lung Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 434 days.

(21) Appl. No.: 18/075,423

(22) Filed: Dec. 6, 2022

(65) Prior Publication Data
US 2024/0145453 A1    May 2, 2024

(30) Foreign Application Priority Data

Nov. 2, 2022   (TW) .................................. 111141745

(51) Int. Cl.
| | |
|---|---|
| *H01L 23/498* | (2006.01) |
| *G09F 9/30* | (2006.01) |
| *G09F 9/33* | (2006.01) |
| *H01L 25/075* | (2006.01) |
| *H01L 25/16* | (2023.01) |
| *H10H 20/857* | (2025.01) |

(52) U.S. Cl.
CPC ........ *H01L 25/165* (2013.01); *H01L 25/0753* (2013.01); *H01L 25/167* (2013.01)

(58) Field of Classification Search
CPC . H01L 25/165; H01L 25/0753; H01L 25/167; H01L 23/4985; G09F 9/3026; G09F 9/33; G09F 9/335; H10H 20/857; H10H 20/80
See application file for complete search history.

(56) References Cited

U.S. PATENT DOCUMENTS

| | | |
|---|---|---|
| 8,994,042 B2 | 3/2015 | Kang et al. |
| 9,123,593 B2 | 9/2015 | Kang et al. |
| 9,366,929 B2 | 6/2016 | Kang et al. |
| 9,632,381 B2 | 4/2017 | Kang et al. |
| 11,131,894 B2 | 9/2021 | Chang et al. |

(Continued)

FOREIGN PATENT DOCUMENTS

| | | |
|---|---|---|
| CN | 104181734 | 9/2017 |
| CN | 110061028 | 3/2021 |

(Continued)

*Primary Examiner* — Omar F Mojaddedi
(74) *Attorney, Agent, or Firm* — JCIPRNET

(57) ABSTRACT

A display panel includes a circuit substrate, light emitting elements, a side wire, and a chip-on-film package structure. The circuit substrate includes a circuit structure located on a first surface. The side wire includes a first bonding portion disposed on the first surface of the circuit substrate and bonded to the circuit structure, a first extension portion, a second extension portion, and a second bonding portion that are sequentially connected and have the same resistivity. The first extension portion is disposed on a side surface of the circuit substrate. The second extension portion is disposed on a second surface of the circuit substrate and overlapped with a peripheral region. The second bonding portion is disposed on the second surface of the circuit substrate. An orthogonal projection of the second bonding portion is overlapped with a display region. The chip-on-film package structure is bonded to the second bonding portion.

16 Claims, 12 Drawing Sheets

(56) References Cited

U.S. PATENT DOCUMENTS

| | | | |
|---|---|---|---|
| 2010/0315570 A1* | 12/2010 | Mathew | G06F 1/1601 |
| | | | 349/56 |
| 2014/0339574 A1 | 11/2014 | Kang et al. | |
| 2015/0179670 A1 | 6/2015 | Kang et al. | |
| 2015/0323848 A1 | 11/2015 | Kang et al. | |
| 2016/0172346 A1* | 6/2016 | Koresawa | G02F 1/133305 |
| | | | 257/99 |
| 2016/0306248 A1 | 10/2016 | Kang et al. | |
| 2021/0173272 A1* | 6/2021 | Chang | H10K 59/1315 |
| 2021/0231994 A1* | 7/2021 | Lu | G02F 1/13452 |
| 2023/0290916 A1* | 9/2023 | Um | H01L 25/16 |
| 2024/0055571 A1* | 2/2024 | Huang | G06F 1/169 |

FOREIGN PATENT DOCUMENTS

| | | |
|---|---|---|
| CN | 108628041 | 5/2021 |
| CN | 114364170 | 4/2022 |
| CN | 114388679 | 4/2022 |
| CN | 110224079 | 6/2022 |
| TW | I714376 | 12/2020 |
| TW | I773504 | 8/2022 |

\* cited by examiner

DISPLAY PANEL AND DISPLAY DEVICE

CROSS-REFERENCE TO RELATED APPLICATION

This application claims the priority benefit of Taiwan application serial no. 111141745, filed on Nov. 2, 2022. The entirety of the above-mentioned patent application is hereby incorporated by reference herein and made a part of this specification.

TECHNICAL FIELD

The disclosure relates to a display panel and a display device.

DESCRIPTION OF RELATED ART

With the rapid development of display technologies, the market demand for large format displays (LFDs) is also increasing. At present, a splicing technology is one of the main options to form the LFDs.

The splicing technology is to splice a plurality of smaller-sized display panels to form the LFD. However, due to the relatively large thickness of a flexible circuit board located on a side of the display panel, after the display panels are spliced, seams are prone to be formed in the splicing display panels, thus resulting in discontinuous displayed images. Therefore, a method capable of solving said problem is needed.

SUMMARY

The disclosure relates to a display panel and a display device of which border frames have a reduced thickness, and a process margin of a bonding process of a chip-on-film package structure may be improved in the display panel and the display device.

At least one embodiment of the disclosure provides a display panel. The display panel includes a circuit substrate, a plurality of light emitting elements, a side wire, and a chip-on-film package structure. The circuit substrate has a first surface, a second surface opposite to the first surface, and a side surface connected to the first surface and the second surface, where the circuit substrate includes a circuit structure located on the first surface, and the first surface includes a display region and a peripheral region. The light emitting elements are disposed on the display region and include a first bonding portion, a first extension portion, a second extension portion, and a second bonding portion. The first bonding portion is disposed on the first surface and bonded to the circuit structure. The first extension portion is disposed on the side surface. The second extension portion is disposed on the second surface and overlapped with the peripheral region in a normal direction of the second surface. The second bonding portion is disposed on the second surface and overlapped with the display region in the normal direction of the second surface, where the first bonding portion, the first extension portion, the second extension portion, and the second bonding portion are sequentially connected and have the same resistivity. The chip-on-film package structure is electrically connected to the second bonding portion.

At least one embodiment of the disclosure provides a display device that includes at least two display panels, and the display panels are spliced together.

In light of the foregoing, the chip-on-film package structure is bonded to the second bonding portion of the side wire located on the second surface; hence, the display panel may have narrowed border frames, and a screen ratio of the display device may be further improved. Besides, the second bonding portion is overlapped with the display region, and thus the chip-on-film package structure may have a relatively large space for performing bonding and repairing processes, whereby a process margin of the bonding process of the chip-on-film package structure is improved.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
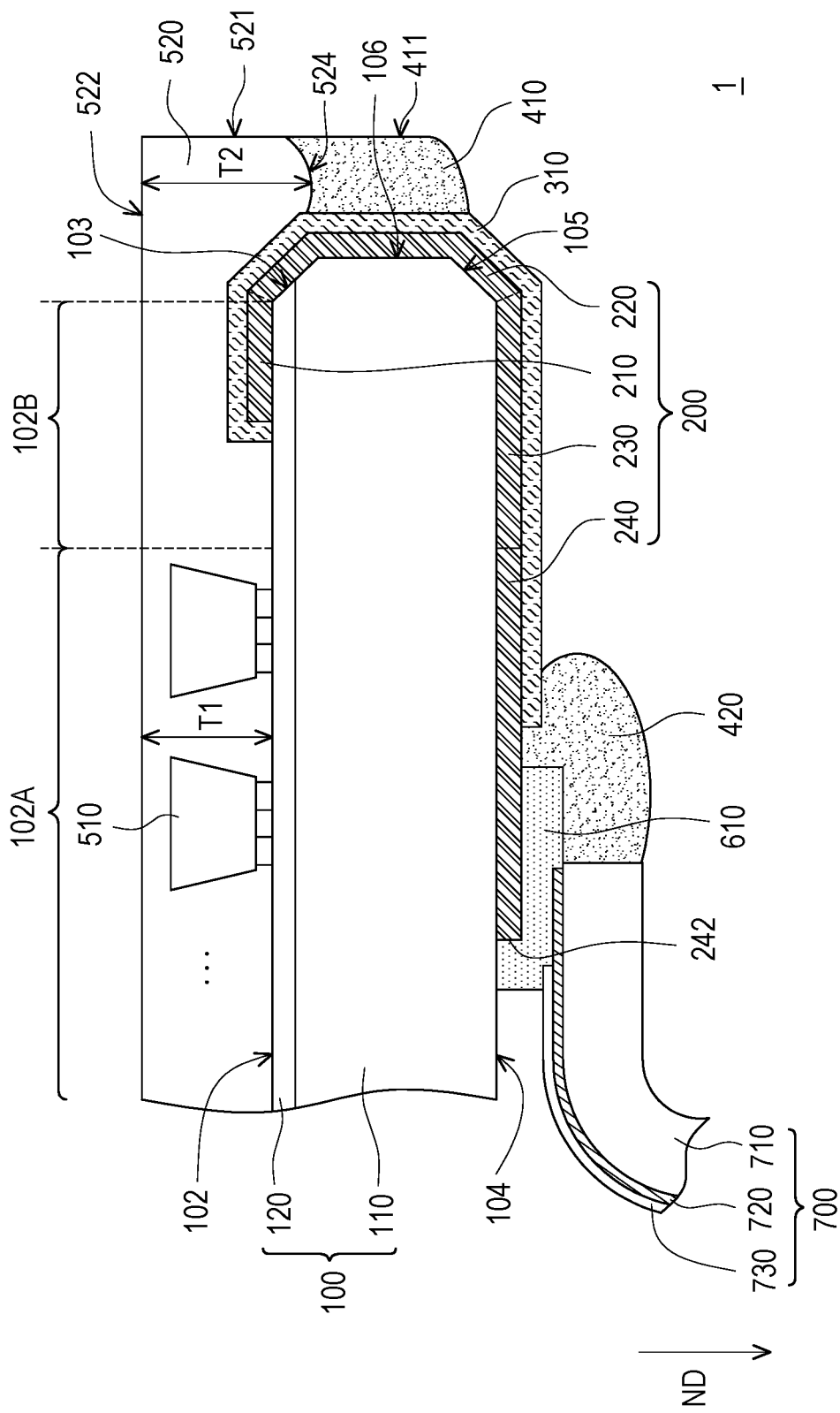
FIG. 1A is a schematic partial cross-sectional view of a display panel according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
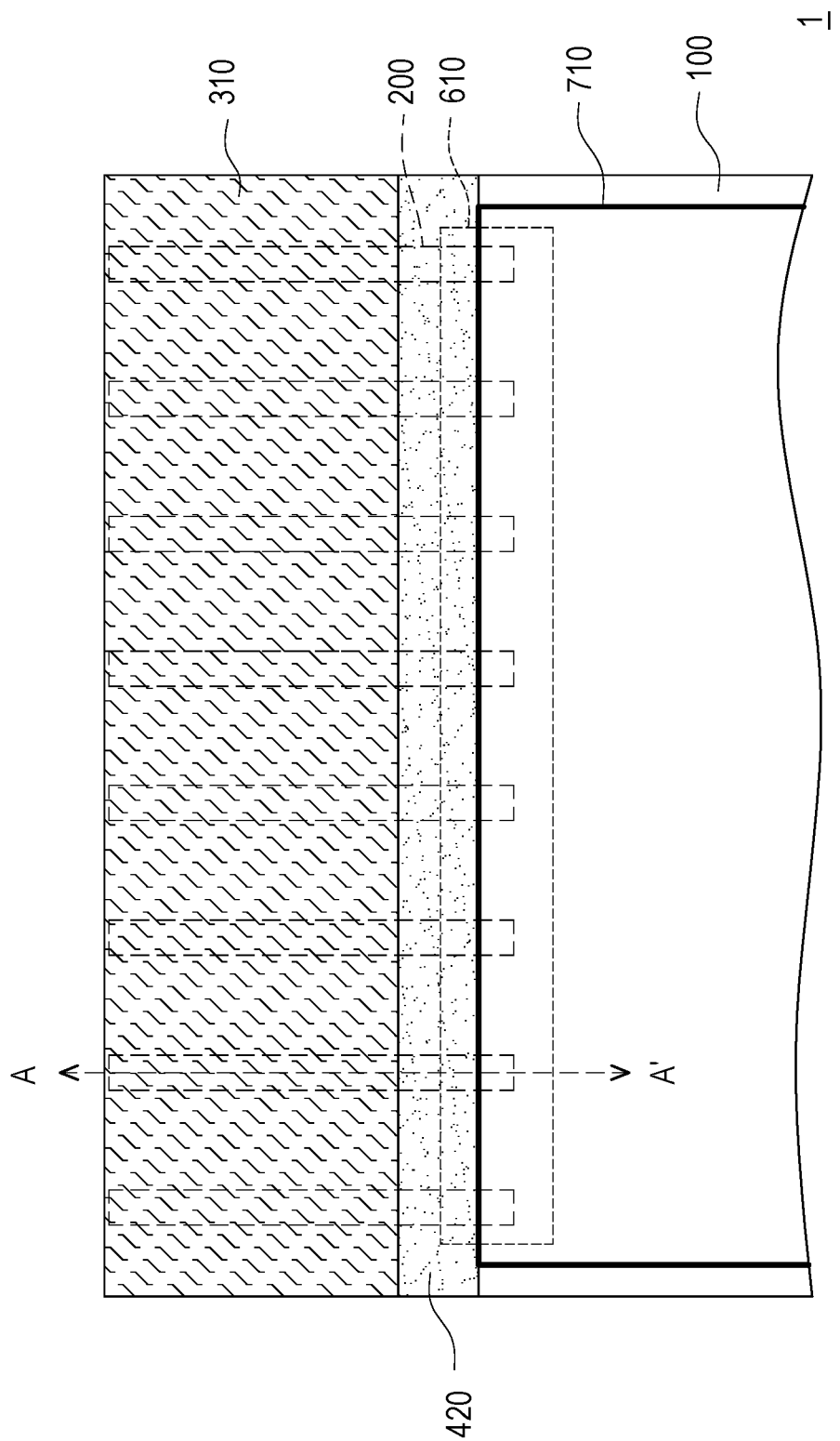
FIG. 1B is a schematic bottom view of the display panel depicted in FIG. 1A.

FIG. 1A is a schematic partial cross-sectional view of a display panel according to an embodiment of the disclosure. FIG. 1B is a schematic bottom view of the display panel depicted in FIG. 1A. FIG. 1A corresponds to where a line A-A' in FIG. 1B is located. With reference to FIG. 1A and FIG. 1B, a display panel 1 includes a circuit substrate 100, a plurality of light emitting elements 510, a side wire 200, and a chip-on-film package structure 700. In this embodiment, the display panel 1 further includes a first insulation layer 310, a first sealant 410, a second sealant 420, a package layer 520, and a conductive connection structure 610.

The circuit substrate 100 has a first surface 102, a second surface 104 opposite to the first surface 102, and a side surface 106 connecting the first surface 102 and the second surface 104. In some embodiments, the circuit substrate 100 includes a substrate 110 and a circuit structure 120, where the circuit structure 120 is located on substrate 110 and is located on the first surface 102 of the circuit substrate 100. The substrate 110 is, for instance, a rigid substrate. However, the disclosure is not limited thereto, and in other embodiments, the substrate 110 may also be a flexible substrate or a stretchable substrate. For instance, a material of the rigid substrate may include glass, quartz, or other appropriate materials; a material of the flexible substrate may include plastic or other appropriate materials; a material of the stretchable substrate may include polyimide (PI) film, or other appropriate materials. The circuit structure 120 includes, for instance, a plurality of conductive layers (not shown) and a plurality of insulation layers (not shown). In some embodiments, the circuit structure 120 further includes a plurality of active elements (not shown) and/or a plurality of passive elements (not shown), and the active elements (not shown) may be thin film transistors.

The first surface 102 includes a display region 102A and a peripheral region 102B, the light emitting elements 510 are disposed in the display region 102A but not disposed in the peripheral region 102B, and the light emitting elements 510 are electrically connected to the circuit structure 120. In some embodiments, the light emitting elements 510 include micro light emitting diodes (micro LEDs), mini light emitting diodes (mini LEDs), organic light emitting diodes (OLEDs), or other appropriate light emitting elements. The circuit structure 120 extends from the display region 102A to the peripheral region 102B. In some embodiments, the circuit structure 120 further includes a plurality of pads (not shown) located in the peripheral region 102B, where the light emitting elements 510 are electrically connected to the pads.

The side wire 200 includes a first bonding portion 210, a first extension portion 220, a second extension portion 230, and a second bonding portion 240, where the first bonding portion 210, the first extension portion 220, the second extension portion 230, and the second bonding portion 240 are sequentially connected. The first bonding portion 210 is disposed on the first surface 102 of the circuit substrate 100 and is electrically connected to the circuit structure 120. For instance, the first bonding portion 210 is directly formed on the pads (not shown) located in the peripheral region 102B and extends from the pads toward the side surface 106 of the circuit substrate 100.

The first extension portion 220 is disposed on the side surface 106 of the circuit substrate 100. In some embodiments, the circuit substrate 100 has a truncated surface 103 between the first surface 102 and the side surface 106 and a truncated surface 105 between the second surface 104 and the side surface 106. The first extension portion 220 is located on the side surface 106, the truncated surface 103, and the truncated surface 105. The truncated surfaces 103 and 105 may prevent overly sharp corners (e.g., a 90-degree sharp-edged corner) causing disconnection of or damages to the side wire 200. In other embodiment, no truncated surface is arranged between the first surface 102 and the side surface 106 and between the second surface 104 and the side surface 106. Instead, a chamfer (a rounded corner) is included between the first surface 102 and the side surface 106 and between the second surface 104 and the side surface 106, and the chamfer design may also reduce the possibility of disconnection of or damages to the side wire 200.

The second extension portion 230 and the second bonding portion 240 are disposed on the second surface 104 of the circuit substrate 100, where the second extension portion 230 is overlapped with the peripheral region 102B in a normal direction ND of the second surface 104 but is not overlapped with the display region 102A, and the second bonding portion 240 is overlapped with the display region 102A in the normal direction ND of the second surface 104 but is not overlapped with the peripheral region 102B. In some embodiments, the second bonding portion 240 is overlapped with the light emitting elements 510 in the normal direction ND of the second surface 104. In some embodiments, the second extension portion 230 and the second bonding portion 240 are formed directly on the substrate 110 of the circuit substrate 100. There is no other conductive wire layer between the second bonding portion 240 and the substrate 110.

In this embodiment, since the first bonding portion 210, the first extension portion 220, the second extension portion 230, and the second bonding portion 240 are formed by applying the same method and are made of the same material, the first bonding portion 210, the first extension portion 220, the second extension portion 230, and the second bonding portion 240 have the same resistivity. For instance, the method of forming the first bonding portion 210, the first extension portion 220, the second extension portion 230, and the second bonding portion 240 includes sputtering, printing, etching, laser engraving, or other appropriate processes, and the material of the first bonding portion 210, the first extension portion 220, the second extension portion 230, and the second bonding portion 240 includes a conductive adhesive (e.g., a silver paste), metal (e.g., copper), graphene, or other appropriate materials. If the first bonding portion 210, the first extension portion 220, the second extension portion 230, and the second bonding portion 240 are formed by applying different methods and are made of different materials, the first bonding portion 210, the first extension portion 220, the second extension portion 230, and the second bonding portion 240 will have different resistivity, which may lead to an increase in the production costs of the side wire 200. For instance, the circuit substrate 100 may need to be formed by applying a double-sided manufacturing process, which seriously affects the yield and the production efficiency.

The first insulation layer 310 extends from the first surface 102 of the circuit substrate 100 to the second surface 104 along the side surface 106 and covers the first bonding portion 210, the first extension portion 220, and the second extension portion 230. In some embodiments, the first insulation layer 310 selectively covers the first extension portion 220. In some embodiments, the first insulation layer 310 selectively covers a portion of the second extension portion 230. In some embodiments, the first insulation layer 310 selectively covers a portion of the second bonding portion 240. In some embodiments, the first insulation layer 310 selectively covers the first extension portion 220 and the second extension portion 230 but does not cover the first bonding portion 210. In some embodiments, the first insulation layer 310 selectively covers the first extension portion 220, the second extension portion 230, and a portion of the second bonding portion 240 but does not cover the first bonding portion 210. A material of the first insulation layer 310 includes silicon oxide, silicon nitride, silicon oxynitride, an organic insulation material, or other appropriate materials.

The package layer 520 is disposed on the first surface 102 of the circuit substrate 100 and covers the light emitting elements 510, a portion of the first insulation layer 310, and a portion of the first bonding portion 210 on the first surface 102. In this embodiment, the package layer 520 further extends beyond the first insulation layer 310 on the side surface 106. Specifically, the package layer 520 has a top surface 522 that is far away from the first surface 102 and an end portion 524 that extends beyond the side surface 106. In this embodiment, the top surface 522 is parallel to the first surface 102. In some embodiments, in the normal direction ND of the second surface 104, there is a first thickness T1 between the top surface 522 and the first surface 102, and there is a second maximum thickness T2 between the top surface 522 and the end portion 524. In this embodiment, the end portion 524 covers a portion of the first extension portion 220, and the second maximum thickness T2 is larger than the first thickness T1. In other embodiments, the end portion 524 does not cover the first extension portion 220, and the second maximum thickness T2 is equal to the first thickness T1. In some embodiments, the package layer 520 may have a single-layer structure or a multi-layer structure, and a material of the package layer 520 includes, for instance, an optical curing adhesive, a thermal curing adhesive, an optical adhesive, or other encapsulants.

The first sealant 410 is located on the side surface 106 of the circuit substrate 100 and covers a portion of the first extension portion 220 and a portion of the first insulation layer 310 on the side surface 106. In this embodiment, a side surface 521 of the package layer 520 and a side surface 411 of the first sealant 410 are coplanar, which should however not be construed as a limitation in the disclosure. In other embodiments, the side surface 521 of the package layer 520 and the side surface 411 of the first sealant 410 are not coplanar.

The chip-on-film package structure 700 is bonded to the second bonding portion 240 of the side wire 200. For instance, the chip-on-film package structure 700 includes a flexible substrate 710, a pin 720, and an insulation layer 730. The pin 720 and the insulation layer 730 are located on the flexible substrate 710, where the insulation layer 730 covers a portion of the pin 720. The conductive connection structure 610 bonds the pin 720 of the chip-on-film package structure 700 to the second bonding portion 240 of the side wire 200. In some embodiments, the conductive connection structure 610 is, for instance, an anisotropic conductive adhesive, a solder material, or other appropriate conductive structures. In this embodiment, the chip-on-film package structure 700 is bonded to the end portion 242 of the second bonding portion 240, and the conductive connection structure 610 covers the end portion 242 of the second bonding portion 240.

The second sealant 420 is located on the second surface 104 of the circuit substrate 100 and is in contact with the second bonding portion 240 between the chip-on-film package structure 700 and the first insulation layer 310. In this embodiment, the second sealant 420 covers the second extension portion 230 and/or the second bonding portion 240 between the chip-on-film package structure 700 and the first insulation layer 310, thereby preventing the second extension portion 230 and/or the second bonding portion 240 from being exposed. The second sealant 420 is located between the first insulation layer 310 and the conductive connection structure 610. In this embodiment, the first sealant 410 is separated from the second sealant 420. The first sealant 410 and the second sealant 420 may be made of the same or different materials. For instance, the first sealant 410 includes a light-absorbing insulation material, thereby better solving a light leakage issue at the seams in the splicing display device, while the second sealant 420 may be made of a light-absorbing insulation material, a transparent material, or a reflective material.

Based on the above, the second bonding portion 240 is overlapped with the display region 102A, the chip-on-film package structure 700 is overlapped with the display region 102A but is not overlapped with the peripheral region 102B, and a distance between the chip-on-film package structure 700 and the side surface of the circuit substrate 100 is relatively long. Hence, the process margin of the bonding process of the chip-on-film package structure 700 may be improved, and takt-time on the production may be reduced. In addition, since the second bonding portion 240 is overlapped with the display region 102A, the second bonding portion 240 has a relatively large room for circuit layout.

Figure 2:
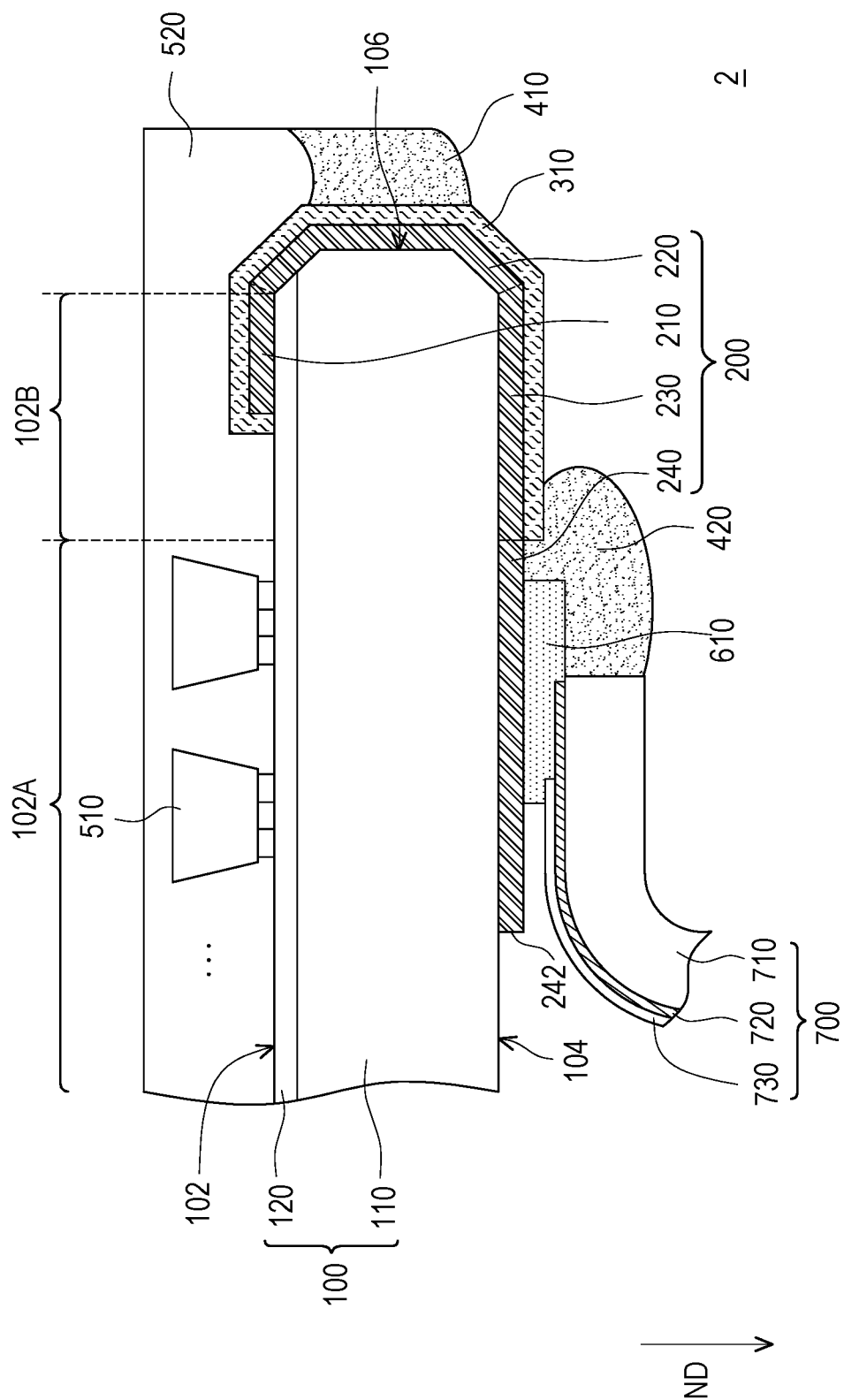
FIG. 2 is a schematic partial cross-sectional view of a display panel according to an embodiment of the disclosure.

FIG. 2 is a schematic partial cross-sectional view of a display panel 2 according to an embodiment of the disclosure. Note that the reference numbers and some content provided in the embodiment depicted in FIG. 2 are derived from the reference numbers and some content provided in the previous embodiment depicted in FIG. 1A and FIG. 1B, the same reference numbers serve to denote the same or similar devices, and the description of the same technical content is omitted. The omitted description may be referred to as the description provided in the previous embodiments and will not be repeated in the following embodiments.

The difference between the display panel 2 depicted in FIG. 2 and the display panel 1 depicted in FIG. 1A and FIG. 19 includes the following: the chip-on-film package structure 700 of the display panel 2 is bonded to the second bonding portion 240, while the bonding location is far away from the end portion 242 of the second bonding portion 240. The conductive connection structure 610 is not in contact with the end portion 242.

Figure 3:
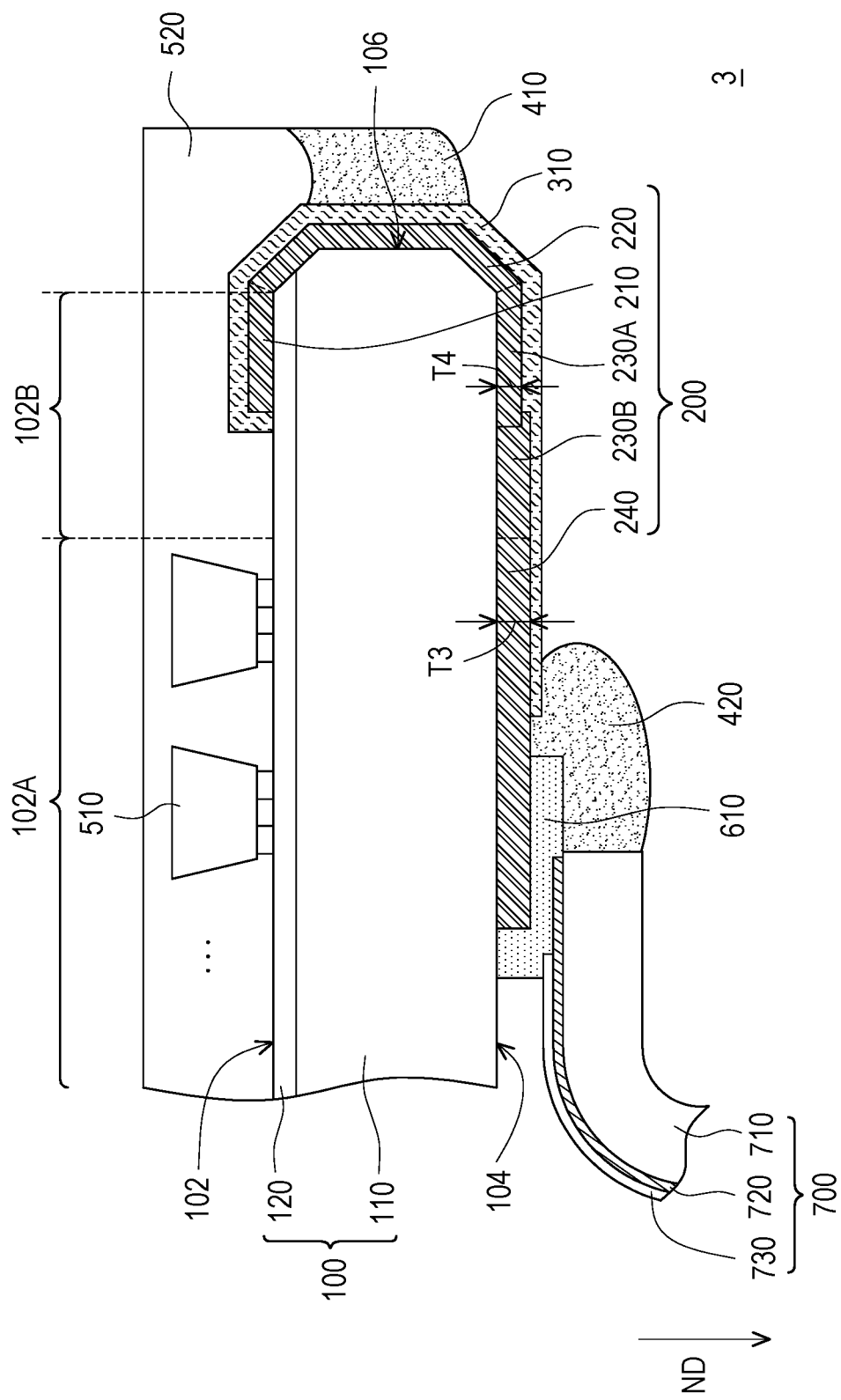
FIG. 3 is a schematic partial cross-sectional view of a display panel according to an embodiment of the disclosure.

FIG. 3 is a schematic partial cross-sectional view of a display panel 3 according to an embodiment of the disclosure. Note that the reference numbers and some content provided in the embodiment depicted in FIG. 3 are derived from the reference numbers and some content provided in the previous embodiment depicted in FIG. 1A and FIG. 1B, the same reference numbers serve to denote the same or similar devices, and the description of the same technical content is omitted. The omitted description may be referred to as the description provided in the previous embodiments and will not be repeated in the following embodiments.

The difference between the display panel 3 depicted in FIG. 3 and the display panel 1 depicted in FIG. 1A and FIG. 1B includes the following: the side wire 200 of the display panel 3 includes different thicknesses.

With reference to FIG. 3, the side wire 200 includes the first bonding portion 210, the first extension portion 220, the second extension portion, and the second bonding portion 240. In this embodiment, the second extension portion includes a first portion 230A and a second portion 230B, where the first bonding portion 210, the first extension portion 220, the first portion 230A, the second portion 230B, and the second bonding portion 240 are connected in sequence.

The first portion 230A and the second portion 230B of the second extension portion are disposed on the second surface 104 of the circuit substrate 100, where the first portion 230A and the second portion 230B of the second extension portion are overlapped with the peripheral region 102B in the normal direction ND of the second surface 104.

In some embodiments, the first bonding portion 210, the first extension portion 220, and the first portion 230A are formed in the same manufacturing process, and the second portion 230B and the second bonding portion 240 are formed in another manufacturing process. For instance, the first bonding portion 210, the first extension portion 220, and the first portion 230A are formed on the first surface 102, the side surface 106, and the second surface 104 of the circuit substrate 100, and the second portion 230B and the second bonding portion 240 are then formed on the second surface 104 of the circuit substrate 100, which should however not be construed as a limitation in the disclosure. In other embodiments, the second portion 230B and the second bonding portion 240 are formed on the second surface 104 of the circuit substrate 100, and the first bonding portion 210, the first extension portion 220, and the first portion 230A are then formed on the first surface 102, the side surface 106, and the second surface 104 of the circuit substrate 100. In this embodiment, a thickness T3 of the second portion 230B and the second bonding portion 240 is larger than a thickness T4 of the first portion 230A.

In this embodiment, since the first bonding portion 210, the first extension portion 220, the first portion 230A, the second portion 230B, and the second bonding portion 240 are formed by applying the same method and are made of the same material, the first bonding portion 210, the first extension portion 220, the first portion 230A, the second portion 230B, and the second bonding portion 240 have the same resistivity.

Figure 4:
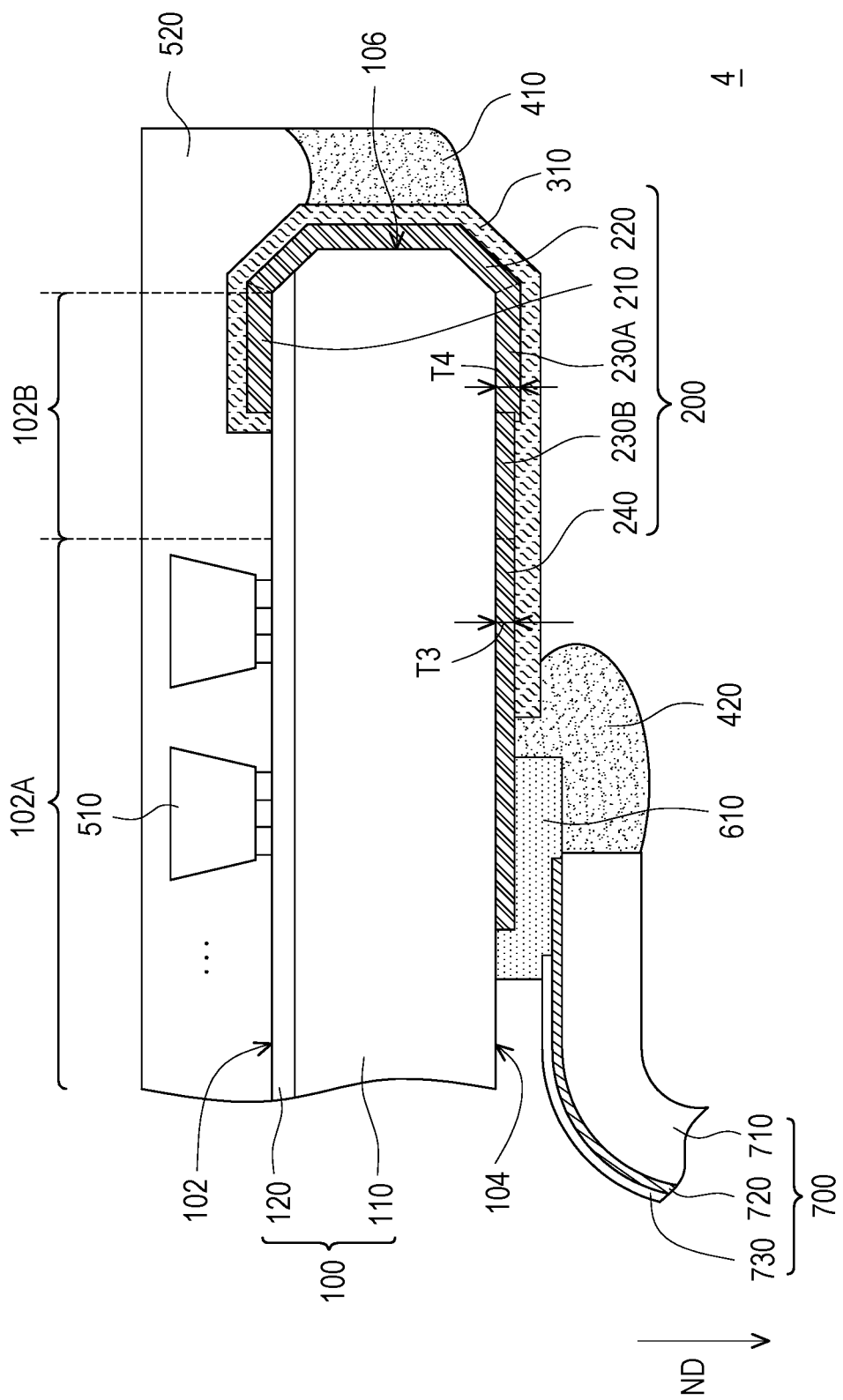
FIG. 4 is a schematic partial cross-sectional view of a display panel according to an embodiment of the disclosure.

FIG. 4 is a schematic partial cross-sectional view of a display panel 4 according to an embodiment of the disclosure. Note that the reference numbers and some content provided in the embodiment depicted in FIG. 4 are derived from the reference numbers and some content provided in the previous embodiment depicted in FIG. 3, the same reference numbers serve to denote the same or similar devices, and the description of the same technical content is omitted. The omitted description may be referred to as the description provided in the previous embodiments and will not be repeated in the following embodiments.

The difference between the display panel 4 depicted in FIG. 4 and the display panel 3 depicted in FIG. 3 includes the following: the thickness T3 of the second portion 230B and the second bonding portion 240 of the side wire 200 of the display panel 4 is smaller than the thickness T4 of the first portion 230A.

Figure 5:
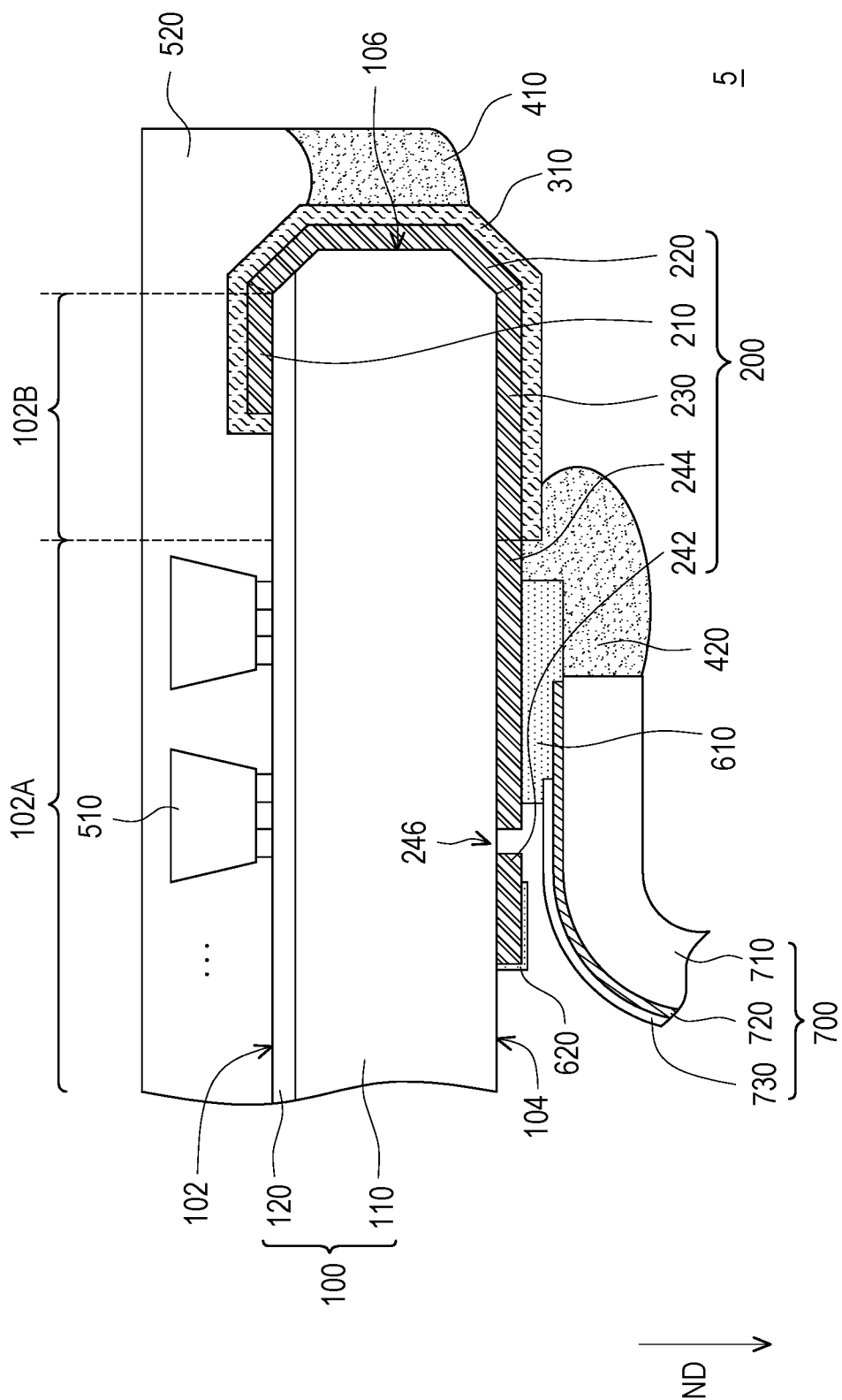
FIG. 5 is a schematic partial cross-sectional view of a display panel according to an embodiment of the disclosure.

FIG. 5 is a schematic partial cross-sectional view of a display panel 5 according to an embodiment of the disclosure. Note that the reference numbers and some content provided in the embodiment depicted in FIG. 5 are derived from the reference numbers and some content provided in the previous embodiment depicted in FIG. 2, the same reference numbers serve to denote the same or similar devices, and the description of the same technical content is omitted. The omitted description may be referred to as the description provided in the previous embodiments and will not be repeated in the following embodiments.

The difference between the display panel 5 depicted in FIG. 5 and the display panel 2 depicted in FIG. 2 includes the following: the second bonding portion of the side wire 200 of the display panel 5 includes the end portion 242 and a maintenance portion 244, where the end portion 242 is farther away from the second extension portion 230 than the maintenance portion 244 is.

With reference to FIG. 5, the first bonding portion 210, the first extension portion 220, the second extension portion, and the maintenance portion 244 are connected in sequence. The maintenance portion 244 and the end portion 240B are connected to each other or separated from each other. The chip-on-film package structure 700 is bonded to the maintenance portion 244.

In some embodiments, the chip-on-film package structure is bonded to the end portion 242, and when the chip-on-film package structure is found to be faulty or is poorly bonded to the end portion 242, the chip-on-film package structure on the end portion 242 is removed. In some embodiments, during the removal process, cracks 246 may be generated in the second bonding portion, where the cracks 246 are located, for instance, between a portion of the end portion 242 and the maintenance portion 244. In addition, in the removal process, the conductive connection structure configured for bonding the faulty chip-on-film package structure may be partially left in the end portion 242, so that the end portion 242 has a conductive connection structure residue 620 thereon. After the removal process, the chip-on-film package structure 700 is re-bonded to the maintenance portion 244. Since the maintenance portion 244 and the end portion 242 are both overlapped with the display region 102A in the normal direction ND of the second surface 104 or are both overlapped with the display region 102A but are not overlapped with the peripheral region 102B, the chip-on-film package structure 700 has a relatively large room for maintenance and repair, thereby improving the process margin of the repair process.

In this embodiment, the cracks 246 lead to the disconnection between the end portion 242 and the maintenance portion 244, which should however not be construed as a limitation in the disclosure. In other embodiments, the cracks 246 do not completely disconnect the end portion 242 from the maintenance portion 244, and the end portion 242 and the maintenance portion 244 may be partially connected.

Figure 6:
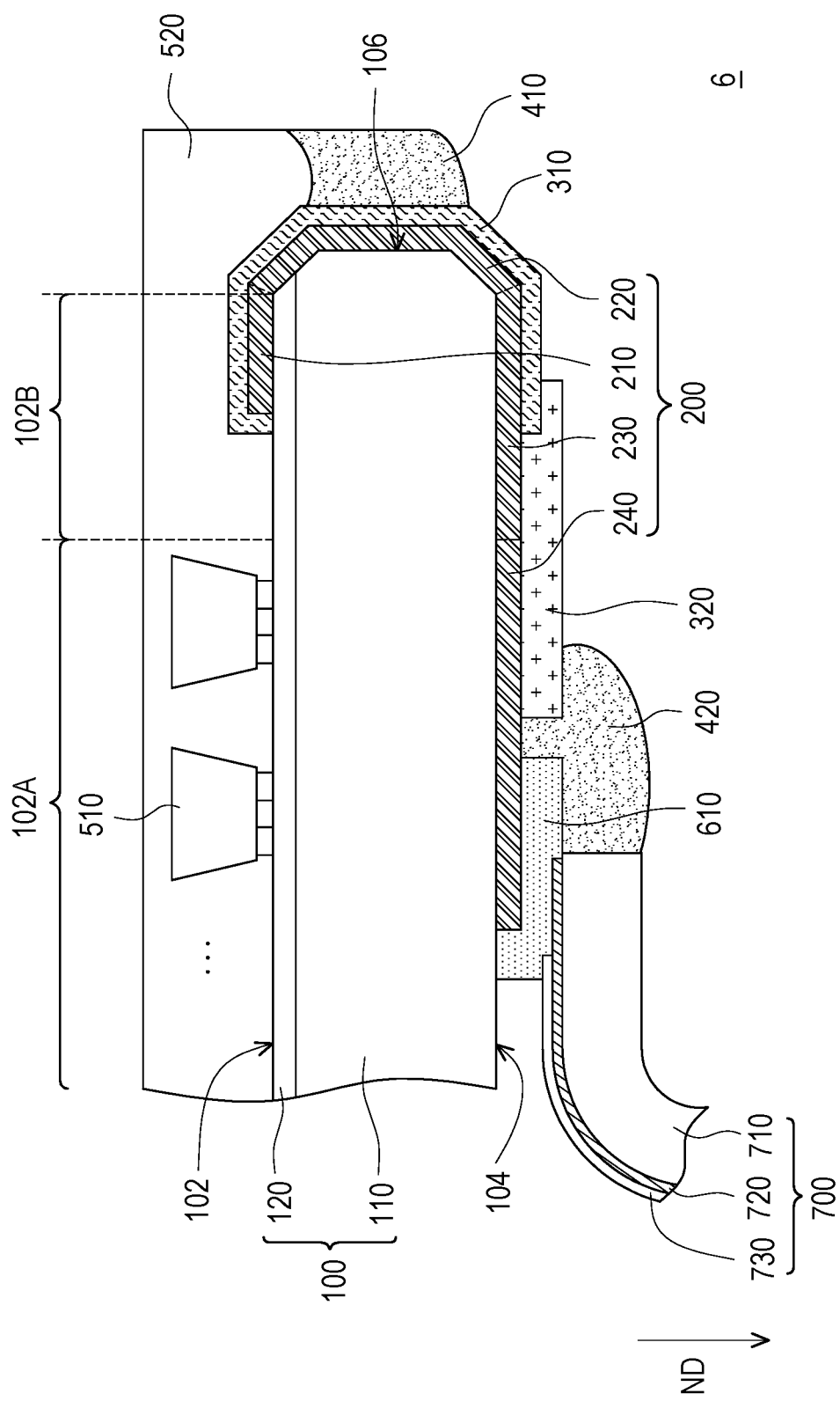
FIG. 6 is a schematic partial cross-sectional view of a display panel according to an embodiment of the disclosure.

FIG. 6 is a schematic partial cross-sectional view of a display panel 6 according to an embodiment of the disclosure. Note that the reference numbers and some content provided in the embodiment depicted in FIG. 6 are derived from the reference numbers and some content provided in the previous embodiment depicted in FIG. 1A and FIG. 1B, the same reference numbers serve to denote the same or similar devices, and the description of the same technical content is omitted. The omitted description may be referred to as the description provided in the previous embodiments and will not be repeated in the following embodiments.

The difference between the display panel 6 depicted in FIG. 6 and the display panel 1 depicted in FIG. 1A and FIG. 1B includes the following: the display panel 6 further includes a second insulation layer 320.

With reference to FIG. 6, the first insulation layer 310 extends from the first surface 102 of the circuit substrate 100 to the second surface 104 along the side surface 106 and covers the first bonding portion 210, the first extension portion 220, and portion of the second extension portion 230. The second insulation layer 320 is disposed on the second surface 104 of the circuit substrate 100 and covers the second extension portion 230 and the second bonding portion 240. The second insulation layer 320 is located between the second sealant 420 and the first insulation layer 310. The second insulation layer 320 is partially overlapped with the display region 102A in the normal direction ND of the second surface 104. In some embodiments, materials of the first insulation layer 310 and the second insulation layer 320 may include the same or different materials. For instance, in some embodiments, the material of the second insulation layer 320 includes a transparent material, a reflective material, or a light-absorbing material. When the material of the second insulation layer 320 includes the reflective material, the brightness of the display panel 6 may be improved.

In this embodiment, the second sealant 420 covers the second extension portion 230 and/or the second bonding portion 240 between the chip-on-film package structure 700 and the second insulation layer 320, thereby preventing the second extension portion 230 and/or the second bonding portion 240 from being exposed. The second sealant 420 is located between the second insulation layer 320 and the conductive connection structure 610.

Figure 7:
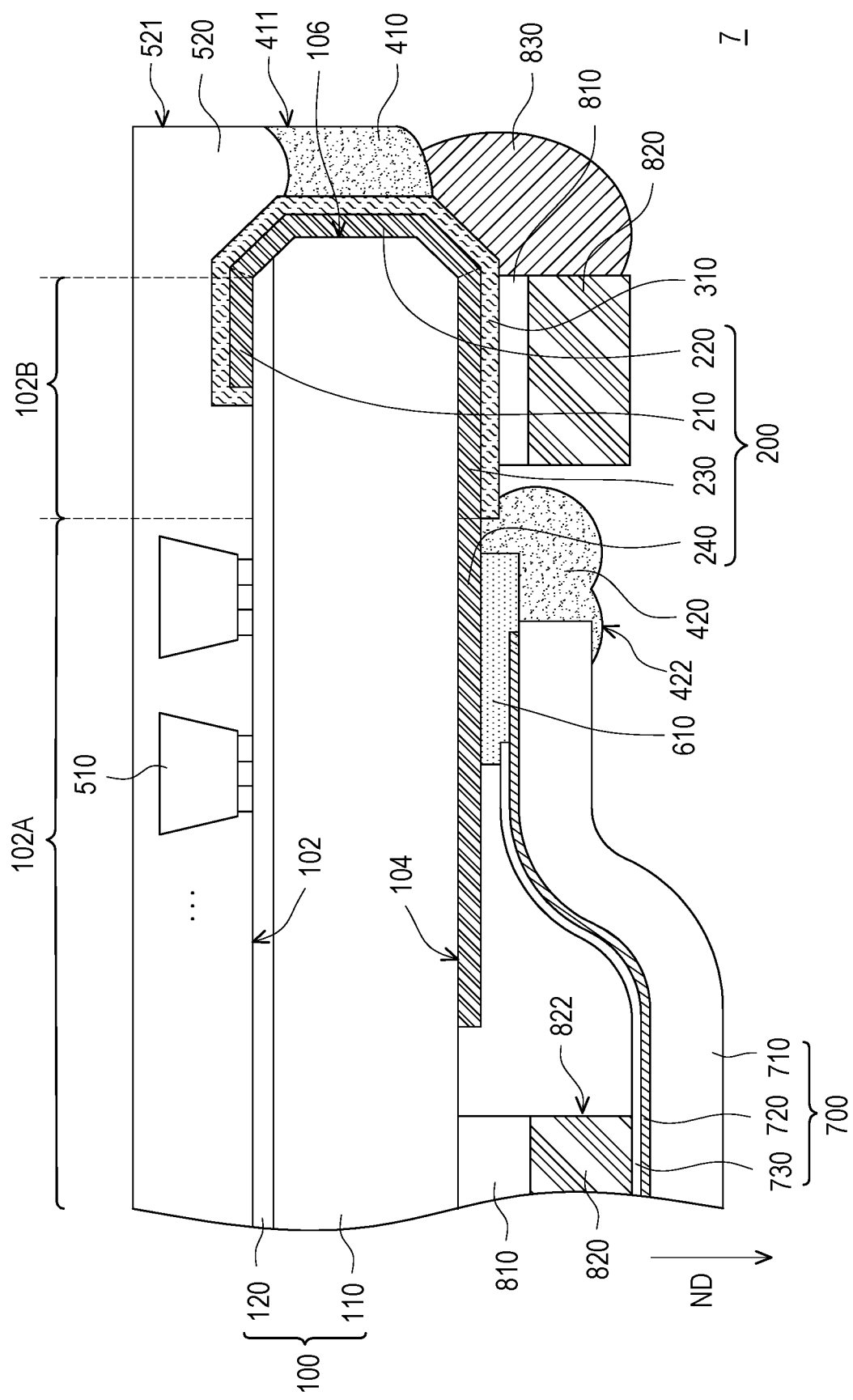
FIG. 7 is a schematic partial cross-sectional view of a display panel according to an embodiment of the disclosure.

FIG. 7 is a schematic partial cross-sectional view of a display panel 7 according to an embodiment of the disclosure. Note that the reference numbers and some content provided in the embodiment depicted in FIG. 7 are derived from the reference numbers and some content provided in the previous embodiment depicted in FIG. 2, the same reference numbers serve to denote the same or similar devices, and the description of the same technical content is omitted. The omitted description may be referred to as the description provided in the previous embodiments and will not be repeated in the following embodiments.

The difference between the display panel 7 depicted in FIG. 7 and the display panel 2 depicted in FIG. 2 includes the following: the display panel 7 further includes a metal plate 820.

With reference to FIG. 7, the metal plate 820 is adhered to the second surface 104 of the circuit substrate 100 through an adhesion layer 810, and the metal plate 820 is adhered to the first insulation layer 310 or the second insulation layer 320 through the adhesion layer 810 (as shown in FIG. 6). The metal plate 820 has an opening 822, and at least a portion of the chip-on-film package structure 700 is located in the opening 822. In some embodiments, a shape of the metal plate 820 includes a ring shape, and the metal plate 820 may have an anti-static function. In some embodiments, the metal plate 820 is electrically connected to a system plate (not shown), for instance, and the chip-on-film package structure 700 is also electrically connected to the system plate.

In some embodiments, a portion of the metal plate 820 is arranged close to an edge of the second surface 104 of the circuit substrate 100, thereby reducing the possible issues caused by the stress around the edges of the circuit substrate 100.

A conductive material 830 is connected to at least one side of the metal plate 820, and a resistivity of the conductive material 830 is smaller than a resistivity of the first sealant 410. In this embodiment, the conductive material 830 is connected to the metal plate 820 and the first sealant 410. In this embodiment, the anti-static ability of the metal plate 820 may be further enhanced through the conductive material 830.

In this embodiment, the side surface 521 of the package layer 520 and the side surface 411 of the first sealant 410 are coplanar; however, the side surface of the package layer 520 and the side surface of the first sealant 410 are not coplanar with a side surface of the conductive material 830.

According to some embodiments, in order to fill a gap between the first insulation layer 310 and the conductive connection structure 610, the second sealant 420 is formed by performing a coating process, a printing process, or other appropriate processes for several times, and thereby a surface of the second sealant 420 includes a wave structure 422.

Figure 8:
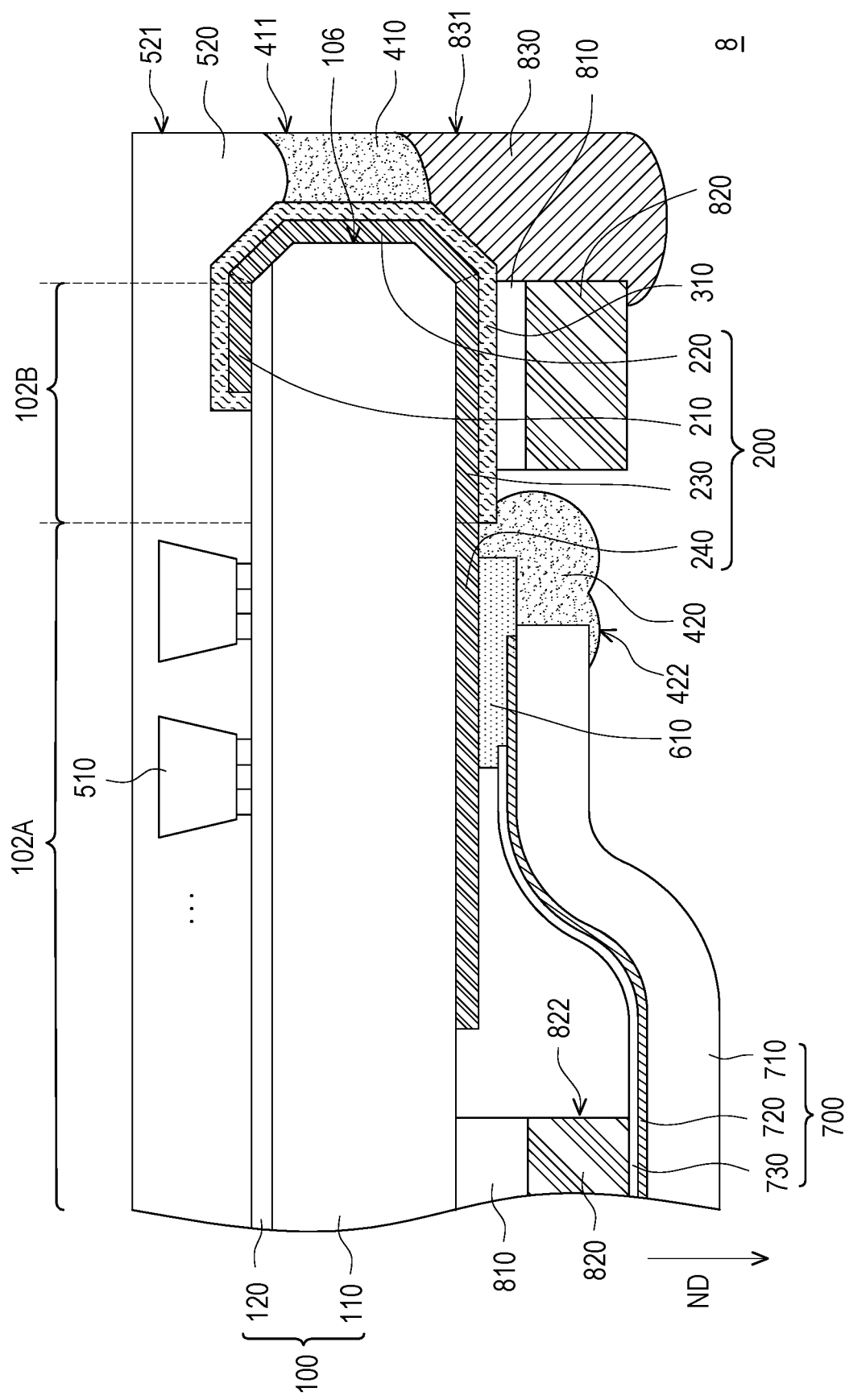
FIG. 8 is a schematic partial cross-sectional view of a display panel according to an embodiment of the disclosure.

FIG. 8 is a schematic partial cross-sectional view of a display panel 8 according to an embodiment of the disclosure. Note that the reference numbers and some content provided in the embodiment depicted in FIG. 8 are derived from the reference numbers and some content provided in the previous embodiment depicted in FIG. 7, the same reference numbers serve to denote the same or similar devices, and the description of the same technical content is omitted. The omitted description may be referred to as the description provided in the previous embodiments and will not be repeated in the following embodiments.

The difference between the display panel 8 depicted in FIG. 8 and the display panel 7 depicted in FIG. 7 includes the following: in the display panel 8, the side surface 521 of the package layer 520, the side surface 411 of the first sealant 410, and a side surface 831 of the conductive material 830 are coplanar. For instance, through a dicing process, the side surface 521 of the package layer 520, the side surface 411 of the first sealant 410, and the side surface 831 of the conductive material 830 are aligned.

Figure 9:
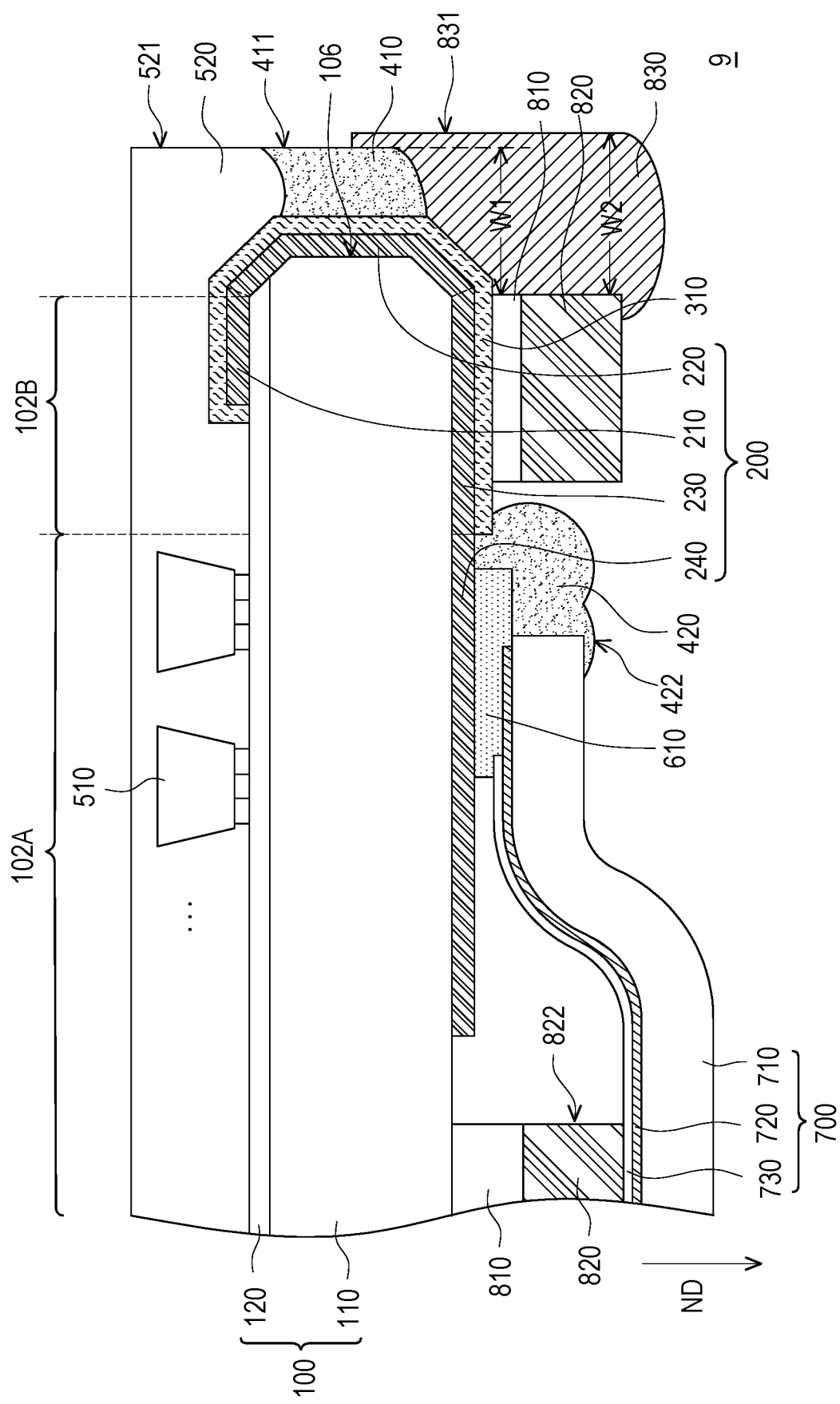
FIG. 9 is a schematic partial cross-sectional view of a display panel according to an embodiment of the disclosure.

FIG. 9 is a schematic partial cross-sectional view of a display panel 9 according to an embodiment of the disclosure. Note that the reference numbers and some content provided in the embodiment depicted in FIG. 9 are derived from the reference numbers and some content provided in the previous embodiment depicted in FIG. 8, the same reference numbers serve to denote the same or similar devices, and the description of the same technical content is omitted. The omitted description may be referred to as the description provided in the previous embodiments and will not be repeated in the following embodiments.

The difference between the display panel 9 depicted in FIG. 9 and the display panel 8 depicted in FIG. 8 includes the following: the side surface 521 of the package layer 520 of the display panel 9 is coplanar with the side surface 411 of the first sealant 410, and the conductive material 830 extends beyond the side surface 411 of the first sealant 410. For instance, a distance W1 from the side surface of the metal plate 820 to the side surface 411 of the first sealant 410 is shorter than a distance W2 from the side surface of the metal plate 820 to the side surface 831 of the conductive material 830.

Figure 10:
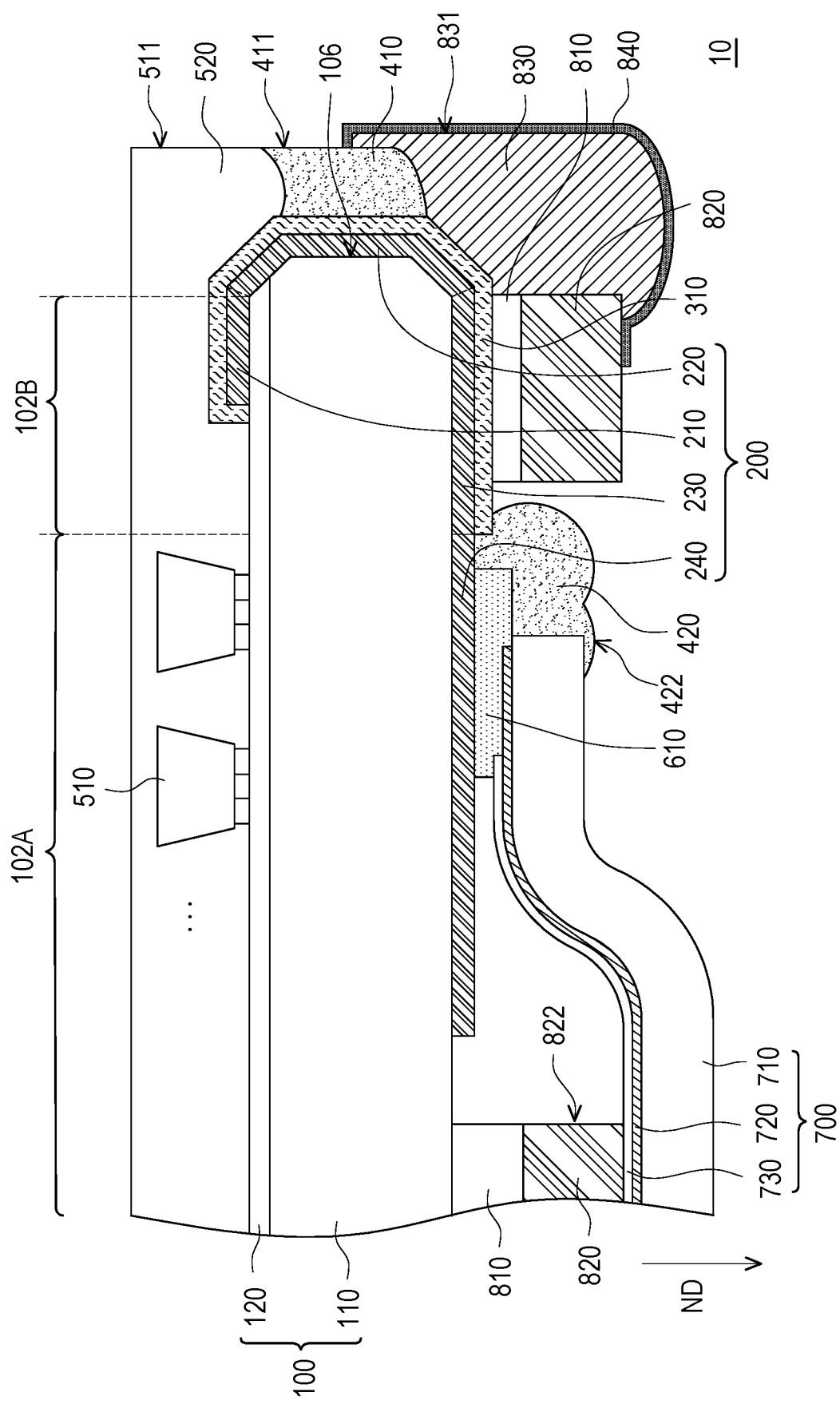
FIG. 10 is a schematic partial cross-sectional view of a display panel according to an embodiment of the disclosure.

FIG. 10 is a schematic partial cross-sectional view of a display panel 10 according to an embodiment of the disclosure. Note that the reference numbers and some content provided in the embodiment depicted in FIG. 10 are derived from the reference numbers and some content provided in the previous embodiment depicted in FIG. 9, the same reference numbers serve to denote the same or similar devices, and the description of the same technical content is omitted. The omitted description may be referred to as the description provided in the previous embodiments and will not be repeated in the following embodiments.

The difference between the display panel 10 depicted in FIG. 10 and the display panel 9 depicted in FIG. 9 includes the following: the display panel 10 further includes a light shielding layer 840.

With reference to FIG. 10, the light shielding layer 840 covers the side surface 831 of the conductive material 830. The light shielding layer 840 is in contact with the first sealant 410 and the metal plate 820. In some embodiments, both the first sealant 410 and the light shielding layer 840 include a light-absorbing insulation material. Through the first sealant 410 and the light shielding layer 840, the light leakage issue at the seams in the splicing display device may be better resolved.

Figure 11:
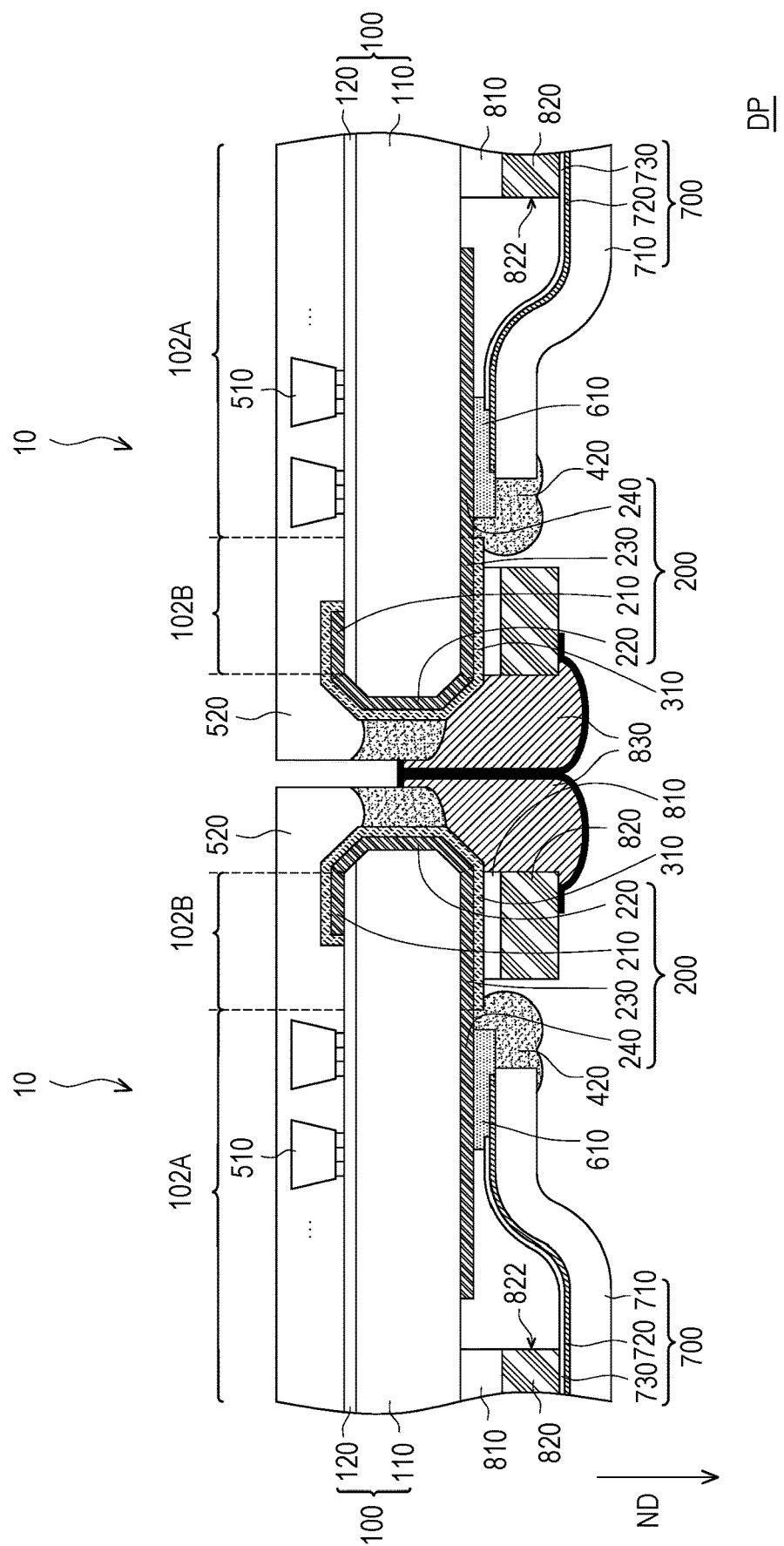
FIG. 11 is a schematic partial cross-sectional view of a display device according to an embodiment of the disclosure.

FIG. 11 is a schematic partial cross-sectional view of a display device DP according to an embodiment of the disclosure. Note that the reference numbers and some content provided in the embodiment depicted in FIG. 11 are derived from the reference numbers and some content provided in the previous embodiment depicted in FIG. 10, the same reference numbers serve to denote the same or similar devices, and the description of the same technical content is omitted. The omitted description may be referred to as the description provided in the previous embodiments and will not be repeated in the following embodiments.

With reference to FIG. 11, in this embodiment, the display device DP includes a plurality of display panels 10, and the display panels 10 are spliced together. For instance, the display device DP includes a plurality of connection mechanisms (not shown), each of the display panels 10 is mounted on a corresponding one of the connection mechanisms, and a plurality of the connection mechanisms are connected together.

In this embodiment, the display device DP, for instance, includes a plurality of the display panels 10 shown in FIG. 10, which should however not be construed as a limitation in the disclosure. In other embodiments, the display device DP includes the display panel 1 depicted in FIG. 1A, the display panel 2 depicted in FIG. 2, the display panel 3 depicted in FIG. 3, the display panel 4 depicted in FIG. 4, the display panel 5 depicted in FIG. 5, the display panel 6 depicted in FIG. 6, the display panel 7 depicted in FIG. 7, the display panel 8 depicted in FIG. 8, or the display panel 9 depicted in FIG. 9.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
    a circuit substrate, having a first surface, a second surface opposite to the first surface, and a side surface connected to the first surface and the second surface, wherein the circuit substrate comprises a circuit structure located on the first surface, and the first surface comprises a display region and a peripheral region;
    a plurality of light emitting elements, disposed on the display region;
    a side wire, comprising:
        a first bonding portion, disposed on the first surface and bonded to the circuit structure;
        a first extension portion, disposed on the side surface;
        a second extension portion, disposed on the second surface and overlapped with the peripheral region in a normal direction of the second surface; and
        a second bonding portion, disposed on the second surface and overlapped with the display region in the normal direction of the second surface, wherein the first bonding portion, the first extension portion, the second extension portion, and the second bonding portion are sequentially connected and have a same resistivity; and
    a chip-on-film package structure, electrically connected to the second bonding portion.

2. The display panel according to claim 1, further comprising:
    a first sealant, located on the side surface of the circuit substrate; and
    a second sealant, located on the second surface of the circuit substrate and contacting the chip-on-film package structure and the second bonding portion, wherein the first sealant is separated from the second sealant.

3. The display panel according to claim 2, further comprising:
    a conductive connection structure, bonding the chip-on-film package structure to the second bonding portion; and
    a first insulation layer, covering the first extension portion and the second extension portion, wherein the second sealant is located between the first insulation layer and the conductive connection structure.

4. The display panel according to claim 2, further comprising:
    a first insulation layer, covering the first extension portion and the second extension portion; and
    a second insulation layer, covering the second bonding portion, wherein the second insulation layer is located between the second sealant and the first insulation layer.

5. The display panel according to claim 4, wherein the first insulation layer and the second insulation layer comprise different materials.

6. The display panel according to claim 4, further comprising:
    a metal plate, adhered to the second surface of the circuit substrate through an adhesion layer and adhered to the first insulation layer or the second insulation layer through the adhesion layer, wherein the metal plate has an opening, and at least one portion of the chip-on-film package structure is located in the opening.

7. The display panel according to claim 6, further comprising:
    a conductive material, connected to at least one side of the metal plate, wherein a resistivity of the conductive material is smaller than a resistivity of the first sealant.

8. The display panel according to claim 7, further comprising:
    a package layer, disposed on the first surface of the circuit substrate and covering the light emitting elements, wherein a side surface of the package layer, a side surface of the first sealant, and a side surface of the conductive material are not coplanar.

9. The display panel according to claim 7, further comprising:
    a light shielding layer, covering a side surface of the conductive material.

10. The display panel according to claim 9, wherein the light shielding layer contacts the first sealant and the metal plate.

11. The display panel according to claim 2, wherein a surface of the second sealant comprises a wave structure.

12. The display panel according to claim 1, wherein the second extension portion comprises a first portion and a second portion, the first bonding portion, the first extension portion, the first portion, the second portion, and the second bonding portion are sequentially connected, and a thickness of the second bonding portion is larger than or smaller than a thickness of the first portion.

13. The display panel according to claim 1, wherein the second bonding portion comprises an end portion and a maintenance portion, the end portion is farther from the second extension portion than the maintenance portion, the chip-on-film package structure is bonded to the maintenance portion, and cracks exist between the end portion and the maintenance portion.

14. The display panel according to claim 13, further comprising:
    a conductive connection structure residue, located on the end portion.

15. The display panel according to claim 1, wherein the circuit substrate comprises a substrate, the circuit structure is located on the substrate, and the second extension portion and the second bonding portion are directly formed on the substrate.

16. A display device, comprising:
   at least two of the display panels as described in claim 1, the display panels being spliced together.

* * * * *